United States Patent [19]
Riedel

[11] 4,017,801
[45] Apr. 12, 1977

[54] LOW FREQUENCY TRIANGULAR WAVEFORM GENERATOR

[75] Inventor: Ronald J. Riedel, Loveland, Colo.

[73] Assignee: Hewlett-Packard Company, Palo Alto, Calif.

[22] Filed: Mar. 22, 1976

[21] Appl. No.: 669,375

[52] U.S. Cl. ............................... 328/35; 235/197; 307/228; 307/216; 324/79 R; 324/82; 324/83 A; 328/157; 328/181

[51] Int. Cl.² ............ H03K 5/08; H03K 4/10

[58] Field of Search ............ 307/228, 216; 328/35, 328/133, 134, 156, 157, 181; 235/152, 197; 324/79 R, 82, 83 A

[56] References Cited
UNITED STATES PATENTS

| | | | |
|---|---|---|---|
| 3,187,195 | 5/1965 | Stefanov | 324/79 R |
| 3,187,262 | 6/1965 | Crane | 324/83 A |
| 3,652,933 | 3/1972 | Rubner et al. | 324/82 |
| 3,898,559 | 8/1975 | Westra | 324/83 A |

FOREIGN PATENTS OR APPLICATIONS

| | | | |
|---|---|---|---|
| 2,223,438 | 11/1973 | Germany | 328/35 |

*Primary Examiner*—Stanley D. Miller, Jr.
*Attorney, Agent, or Firm*—William E. Hein; Michael L. Sherrard

[57] ABSTRACT

A low frequency triangular waveform generator mixes two high frequency squarewaves having a constant frequency difference to produce a triangular waveform with a fundamental frequency equal to the difference in the fundamental frequencies of the mixed squarewaves. This generator can be adapted to produce squarewaves, sine waves, sawtooth waves, and asymmetrical triangular waves without the use of digital accumulators or ROMs.

5 Claims, 3 Drawing Figures

LOW FREQUENCY TRIANGULAR WAVEFORM GENERATOR

BACKGROUND OF THE INVENTION

This invention relates generally to signal generators and more particularly to signal generating systems for synthesizing low frequency triangular waveforms.

Certain known analog circuits for generating triangular waveforms, such as described by E. Harry Heflin, "Compact Function Generator with Enhanced Capability/Cost Ratio," pages 15–20 of the Hewlett-Packard Journal, July, 1973, rely on linearly charging and discharging a capacitor. By utilizing the principle of phase-locking a voltage controlled oscillator to an input frequency, such as the output of a digital frequency synthesizer, a very accurate frequency synthesis as well as compatibility with a digital input interface for frequency control can be obtained. Another known analog circuit for generating triangular waveforms involves direct switching of the capacitor charging current by the output of a frequency source, such as a digital frequency synthesizer, and a current source with an output proportional to the frequency of its input, such as a digital signal followed by a digital-analog converter and a voltage controlled current source. These prior art analog circuits suffer from many inherent disadvantages when used for generating low frequency triangular waveforms. To cover several decades of frequency generation, all of these methods require a multiplicity of range capacitors which must be switched electronically by expensive analog switches. For low frequency generation these capacitors become prohibitively large. Except for the phase-locked loop, the transfer functions of the current sources (typically voltage controlled) must be very linear, especially at low frequencies, to prevent unwanted changes in triangle amplitude as the input frequency is varied. At frequencies less than 100Hz the settling times of phase-locked loops become excessively long. In addition, the capacitors in the low pass loop filter portion of the phase-locked loop circuit become prohibitively large and expensive when designed for low frequency operation. In summary, no practical analog circuits are known which are capable of generating low frequency triangular waveforms with a high degree of accuracy in frequency and amplitude synthesis.

Certain known digital accumulator type triangular waveform generators such as those described in U.S. Pat. No. 3,633,017 entitled, DIGITAL WAVEFORM GENERATOR, issued on Jan. 4, 1972 to Arthur W. Crooke and in U.S. Pat. No. 3,654,450 entitled, DIGITAL SIGNAL GENERATOR SYNTHESIZER issued on Apr. 4, 1972 to Joseph A. Webb define a generalized method for generating any phase-dependent waveform and for performing frequency, phase and amplitude modulation on the basic waveform. However this method requires, in general, a digital clock, a digital accumulator or counter, and digital logic for mapping the phase into an output waveform. A specialized triangular waveform generator would not require the digital logic for mapping the phase into an output waveform but this would not substantially reduce the complexity of the method. While quite general and accurate, these digital logic accumulator circuits are very complex and expensive when used in the construction of a limited function, low cost waveform generator. In addition, digital logic accumulator circuits are limited in the generation of high frequency waveforms by the switching speeds of their logical components.

SUMMARY OF THE INVENTION

In accordance with the illustrated preferred embodiment of this invention, a low frequency triangular waveform generator is provided. The waveform generator includes means for producing two input squarewaves with a constant frequency difference. This results in a linearly time varying phase difference between the two input squarewaves. These two input waveforms are input into a phase detector with a linear phase to voltage transfer function. The output voltage is of the desired triangular waveform.

It is an object of the present invention to provide a simple, inexpensive and highly accurate low frequency triangular waveform generator.

An incidental object of the present invention is to provide a function generator capable of generating sinusoidal, square and sawtooth waveforms from common circuitry.

These objects are accomplished in accordance with the preferred embodiments of the invention by employing a mixer and a low pass filter as a linear phase detector for linearly transforming the phase relationship between two input squarewaves into an output voltage. In an alternative embodiment an exclusive OR gate is employed in place of the mixer.

DESCRIPTION OF THE PREFERRED EMBODIMENT

Figure 1:
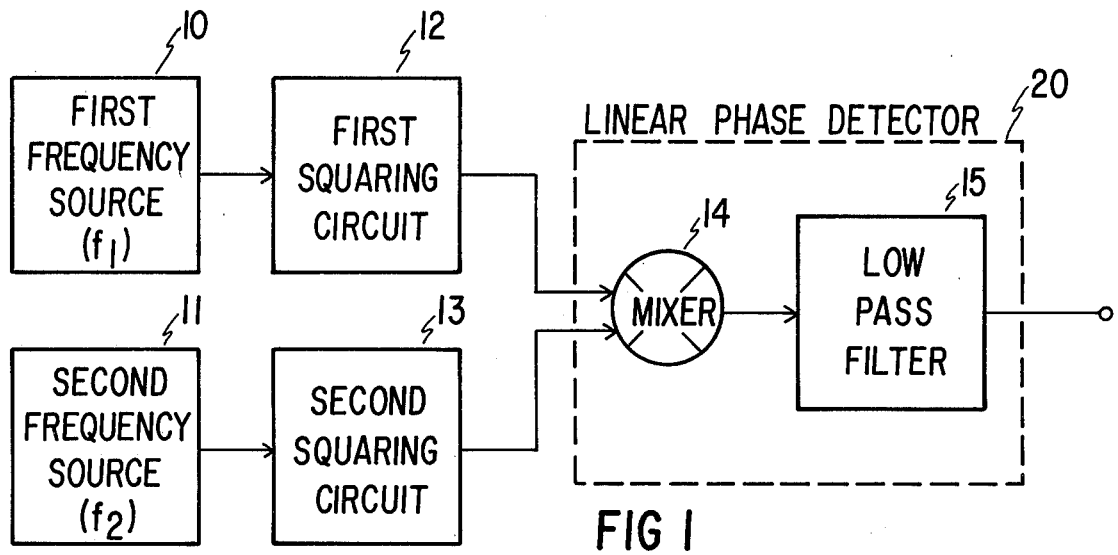
FIG. 1 is a block diagram illustrating a first preferred embodiment of a low frequency triangular waveform generator embodying the principles of the present invention.

Referring to FIG. 1, an embodiment of the invention is illustrated wherein the phase difference between two input sinusoidal waveforms is linearly transformed into a desired triangular voltage waveform by the use of squaring circuits, a mixer and a low pass filter.

Referring to FIG. 1, a first frequency source 10 produces a high frequency sinusoidal waveform having a frequency $f_1$. First frequency source 10 is typically a 40MHz crystal oscillator coupled to a divider to output a 4MHz sinewave. A second frequency source 11 produces a high frequency sinusoidal waveform having a frequency $f_2$. Second frequency source 11 is typically a voltage-tuned-oscillator tunable from 40–60MHz coupled to a divider to output a 4–6MHz sinewave. It may now be appreciated that given two waveforms with frequencies $f_1$ and $f_2$ respectively, the phase difference (0°–180°) between the two frequencies as a function of time is a triangular waveform with a fundamental frequency, $\Delta f$, equal to the difference between the input frequencies $f_2$ and $f_1$.

The phase difference between the input waveforms $f_1$ and $f_2$ is linearly transformed into a voltage by first shaping the sinusoidal waveforms into square waveforms. The output of first frequency source 10 is applied to a first squaring circuit 12. The output of second frequency source 11 is input to a second squaring circuit 13. It is convenient to note at this point that in order to produce clear linear triangle waveforms at high frequencies the output squarewaves from the first and second squaring circuits 12 and 13 must have transition times which are a small proportion (<1%) of the period of the input sinewaves. The outputs from the first and second squaring circuits 12 and 13 are applied to a linear phase detector 20 which linearly transforms the phase difference between the two input squarewaves into the desired triangular waveform. In the first preferred embodiment the linear phase detector consists of a mixer 14 and a low pass filter 15. The outputs from the first and second squaring circuits 12 and 13 are applied to the mixer 14. The output from the mixer 14 is applied to the low pass filter 15 which is designed to pass the fundamental frequency ($\Delta f$) of the triangular waveform and sufficient harmonics (i.e. $3\Delta f$, $5\Delta f$, $7\Delta f$, $9\Delta f$, $11\Delta f$) to produce a triangular waveform of high fidelity but not pass the undesired higher sum and difference frequencies generated by mixing $f_1$ and $f_2$. It will now be appreciated by those persons skilled in the art that in the preferred embodiment the frequency difference, $\Delta f$, between the input squarewaves which is equal to the fundamental frequency of the output waveform, should preferably be at least 40 times lower in frequency than either input squarewave to allow differentiation between the triangular and square waveforms by filtering.

Figure 2:
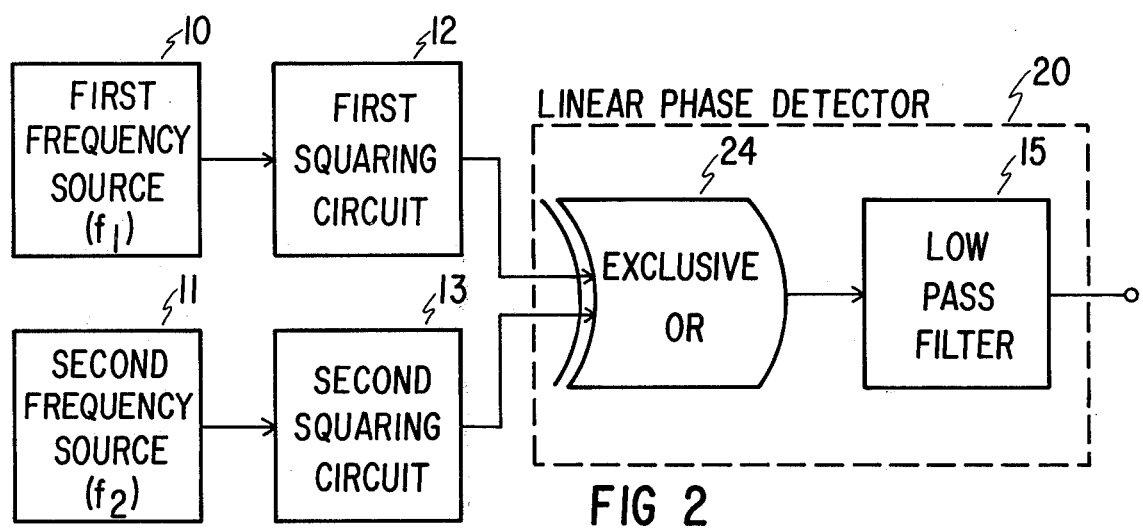
FIG. 2 is a block diagram illustrating a second preferred embodiment of a triangular waveform generator embodying the principle of the present invention.

In a second preferred embodiment of the present invention, shown in FIG. 2, the linear phase detector 20 consists of an exclusive OR gate 24 and the low pass filter 15. This results in an output triangular waveform equivalent to that obtained by the first preferred embodiment except that the phase will be changed by 180°.

The use of a mixer 14 and low pass filter 15 as a linear phase detector for input squarewaves may be explained by a frequency domain analysis of the input and output waveforms. The squarewaves generated by the first and second squaring circuits 12 and 13 are described in the frequency domain by a fundamental frequency and odd harmonics decreasing as $1/n$, where $n$ is the order of the harmonic. When two squarewaves with relatively small difference in fundamental frequencies are mixed, the associated fundamental frequencies and harmonics 'beat' to produce a fundamental frequency $\Delta f$ and odd harmonics decreasing as $1/n^2$. These 'beat' frequencies are the frequency domain description of the desired triangular waveform. Filtering out the unwanted higher frequencies results in the desired waveform.

Figure 3:
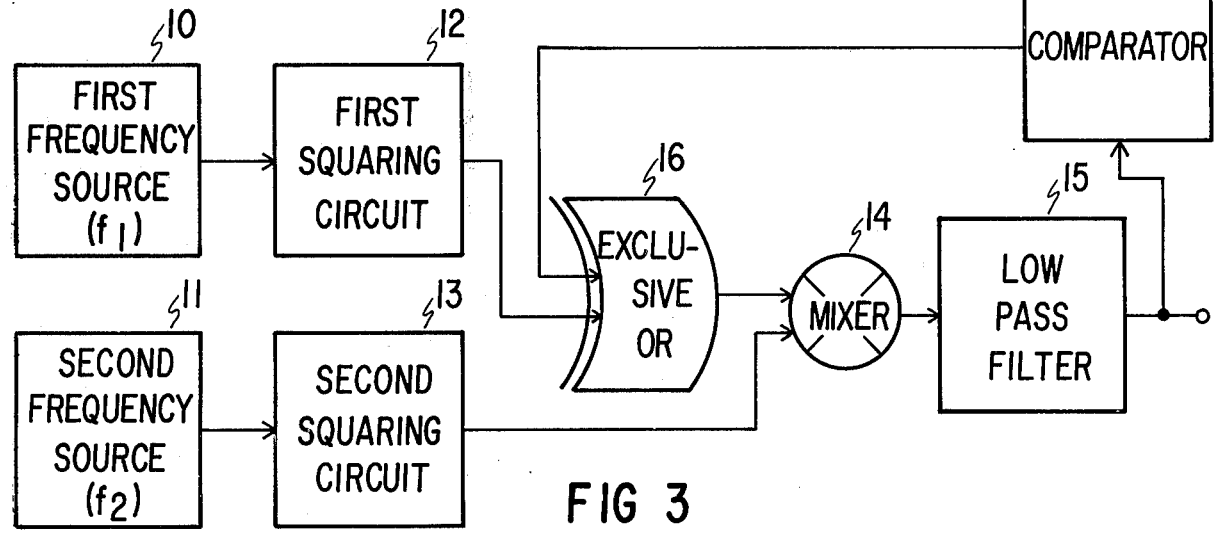
FIG. 3 is a block diagram illustrating a modification to the circuitry of FIG. 1 which results in the generation of sawtooth waveforms.

Referring now to FIG. 3, sawtooth waveforms can be produced by the addition of an exclusive OR gate 16 and a comparator 17. Comparator 17 detects the output of low pass filter 15 and changes its output whenever the peak of the desired triangular waveform is detected. This output and the output from first squaring circuit 12 are applied to exclusive OR gate 16. The output from exclusive OR gate 16 changes phase by 180° whenever the peak of the triangular waveform is sensed by comparator 17. This results in a 180° phase shift in the output from the low pass filter 15. The output from the low pass filter 15 is therefore a sawtooth waveform with a fundamental frequency $2\Delta f$. A person skilled in the art would now realize that the EXCLUSIVE OR gate 16 could be placed anywhere after either squaring circuit and in front of the low pass filter 15 and achieve the same results.

Similarly, the triangular waveform generator of FIG. 1 may be easily arranged to generate squarewaves or sine waves by employing a conventional squaring circuit or diode shaping circuit. In addition, squarewaves and sine waves of higher frequency may be obtained from the circuit of FIG. 1 by directly utilizing the outputs from the first and second frequency sources 10 and 11 and the first and second squaring circuits 12 and 13.

I claim:
1. A circuit for generating sawtooth waveforms, the circuit comprisng:
   first squarewave generating means for providing a first squarewave of frequency $f_1$;
   second squarewave generating means for providing a second squarewave of frequency $f_2$, said second squarewave having a linearly changing phase difference with respect to said first squarewave;
   linear phase detector means responsive to said first and second squarewave generating means for linearly transforming the linearly changing phase difference between said first and second squarewaves into an output waveform;
   comparator means for comparing said output waveform of said linear phase detector to a desired peak value for the output waveform and for detecting when said output waveform equals said desired peak value; and
   phase reversing means for changing the phase of said output waveform by 180° when said comparator means detects the value of said output waveform to be equal to the desired peak value.

2. A circuit for generating sawtooth waveforms as in claim 1 wherein said linear phase detector means comprises:
   a mixer responsive to said first and second squarewaves for generating sum and difference frequencies; and
   a low pass filter coupled to said mixer for passing only the selected lower ones of said difference frequencies representing the derived triangular waveform.

3. A circuit for generating sawtooth waveforms as in claim 1 wherein said linear phase detector means comprises:
   an exclusive OR gate responsive to said first and second squarewaves for generating sum and difference frequencies; and
   a low pass filter coupled to said exclusive OR gate for passing only selected lower ones of said difference frequencies representing the desired triangular waveform.

4. A circuit for generating sawtooth waveforms as in claim 1 wherein said phase reversing means comprises:
   an exclusive OR gate, with a first and second inputs and an output, with the first input and the output serially connected in the circuit at a point between said squarewave generating means and said comparator means, the second input of said exclusive OR gate coupled to said comparator means.

5. A method for generating sawtooth waveforms, the method comprising:
   generating a first squarewave;
   generating a second squarewave having a linearly changing phase difference in respect to said first squarewave;

linearly transforming the phase difference between said first and second squarewaves into an output waveform;

detecting when said output waveform equals a desired peak value; and reversing the phase of said output waveform by 180° when said detecting step detects a condition of equality between said output waveform and said desired peak value.

* * * * *